United States Patent [19]

Baglee

[11] Patent Number: 5,049,958
[45] Date of Patent: Sep. 17, 1991

[54] STACKED CAPACITORS FOR VLSI SEMICONDUCTOR DEVICES

[75] Inventor: David A. Baglee, Albequerque, N. Mex.

[73] Assignee: Texas Instruments Incorporated, Dallas, Tex.

[21] Appl. No.: 520,152

[22] Filed: May 8, 1990

Related U.S. Application Data

[63] Continuation of Ser. No. 303,098, Jan. 27, 1989, abandoned, which is a continuation of Ser. No. 773,832, Sep. 4, 1985, abandoned, which is a continuation of Ser. No. 415,068, Sep. 7, 1982, abandoned.

[51] Int. Cl.⁵ .................... H01L 29/68; H01L 27/02
[52] U.S. Cl. .................... 357/23.6; 357/41; 357/51
[58] Field of Search .................... 357/23.6, 51, 59, 41

[56] References Cited

U.S. PATENT DOCUMENTS

| | | | |
|---|---|---|---|
| 3,519,901 | 7/1970 | Bean et al. | 357/59 |
| 4,017,885 | 4/1977 | Kendall et al. | 357/51 |
| 4,151,607 | 4/1979 | Koyanagi | 365/174 |
| 4,197,554 | 4/1980 | Meusburger et al. | 357/45 |
| 4,249,196 | 3/1981 | Durney et al. | 357/74 |
| 4,355,374 | 10/1982 | Sakai et al. | 357/14 |
| 4,419,743 | 12/1983 | Taguchi et al. | 357/23.6 |
| 4,448,400 | 5/1984 | Harari | 357/23.6 |
| 4,467,450 | 8/1984 | Kuo | 365/149 |
| 4,475,118 | 10/1984 | Klein et al. | 357/51 |

FOREIGN PATENT DOCUMENTS 0031627 3/1977 Japan .................... 357/23 C
58-175855A 10/1983 Japan .

OTHER PUBLICATIONS

K. Ohta, "VSLI Dynamic Memory Cell Using Stacked Ta₂O₅ Capacitor", *Semiconductor Technologies*, 1982, pp. 280-284.
Koyanagi et al, "Novel High Density Stacked Capacitor MOS RAM", Japanese Journal of Appl. Physics, vol. 18 (1979), Supplement 18-1, pp. 35-42.

*Primary Examiner*—Mark Prenty
*Attorney, Agent, or Firm*—Ronald O. Neerings; N. Rhys Merrett; Melvin Sharp

[57] ABSTRACT

A dynamic read/write memory cell array employs stacked capacitors consisting of three levels of conductor separated by dielectric material. In one embodiment, the central level is a common plane, and the upper and lower levels are connected to the source regions of the pair of access transistors of two adjacent cells. In this manner, capacitors for adjacent cells occupy the same area, almost doubling the capacitor value per unit area.

20 Claims, 5 Drawing Sheets

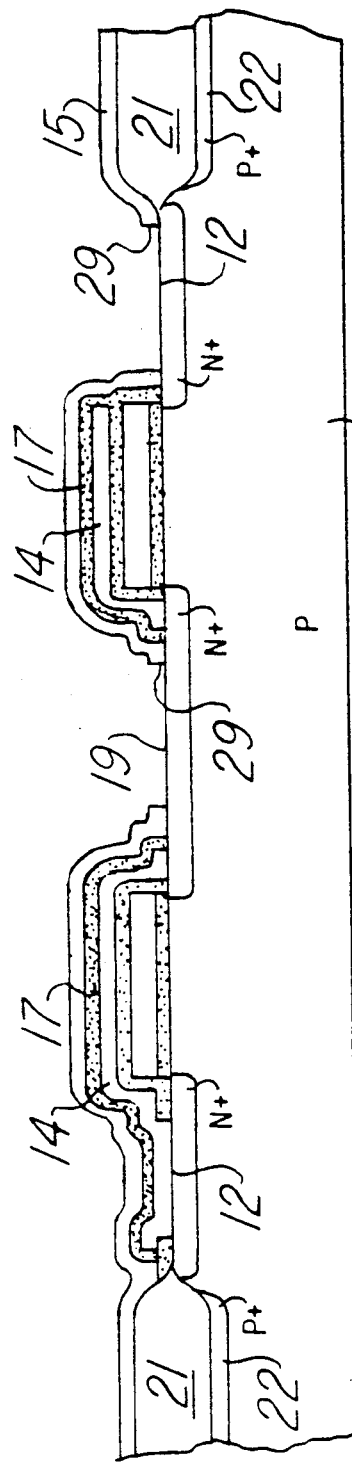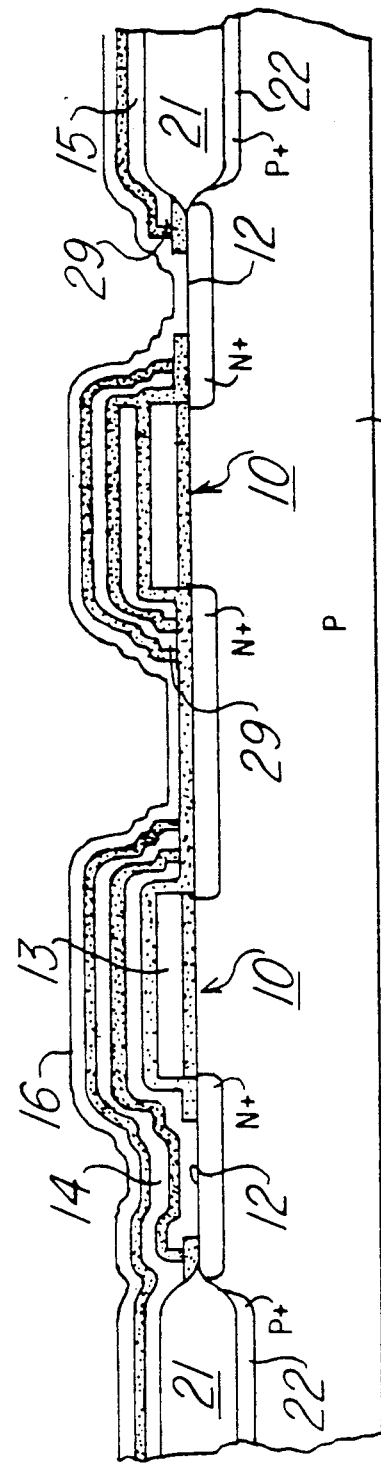

STACKED CAPACITORS FOR VLSI SEMICONDUCTOR DEVICES

This application is a continuation of application Ser. No. 07/303,098, filed Jan. 27, 1989 and now abandoned which is a continuation of Ser. No. 06/773,832 filed Sept. 4, 1985 and now abandoned which is a continuation of Ser. No. 06/415,068 filed Sept. 7, 1982 and now abandoned.

BACKGROUND OF THE INVENTION

This invention relates to semiconductor memory devices, and more particularly to dynamic memory cells using storage capacitors with tantalum oxide dielectric.

Semiconductor memory devices of the dynamic read/write type traditionally are constructed using one-transistor cells with MOS storage capacitors which have silicon oxide dielectric. Over the past ten years, these devices have been made in progressively higher bit density and small cell size; in 1972 4K-bit devices were being designed, progressing through 16K and 64K, and now 256K and 1-Megabit devices are being designed in 1982. The chip size been about the same for all of these. As the capacitor size is reduced, and the number of cells on a bit line is increased, the difficulty in reliably sensing the stored charge is drastically increased. One of the solutions which has been proposed is the use of tantalum capacitors instead of MOS capacitors. Tantalum oxide has a much higher dielectric coefficient, so the capacitance per unit area could be greatly increased, but the change in manufacturing process has not been worthwhile with prior cells. The limitations on the use of silicon oxide storage capacitors may be exceeded for the 1-Megabit dynamic RAM, however, and so a practical cell with tantalum capacitors may be demanded.

It is the principal object of this invention to provide an improved one-transistor dynamic read/write memory cell, more particularly improved storage capacitors for these cells. Another object is to provide an improved tantalum capacitor which may be manufactured compatibly with self-aligned silicon-gate semiconductor processing. A further object is to provide storage capacitors of greater capacitance per unit area for VLSI semiconductor devices.

SUMMARY OF THE INVENTION

In accordance with one embodiment of the invention a dynamic read/write memory cell array employs stacked tantalum capacitors consisting of three levels of tantalum film separated by tantalum oxide. The central level is a common plane, and the upper and lower levels are connected to the source regions of the pair of access transistors of two adjacent cells. In this manner, capacitors for adjacent cells occupy the same area, almost doubling the capacitor value per unit area.

BRIEF DESCRIPTION OF THE DRAWINGS

The novel features believed characteristic of the invention itself, however, as well as other features and advantages thereof, will be best understood by reference to the detailed description which follows, read in conjunction with the accompanying drawings, wherein:

FIGS. 4a-4e are elevation views in section of the cell array of FIGS. 1 and 3a-3e, at successive stages in the manufacturing process, taken generally along the line a—a of FIG. 1.

DETAILED DESCRIPTION OF SPECIFIC EMBODIMENT

Figure 1:
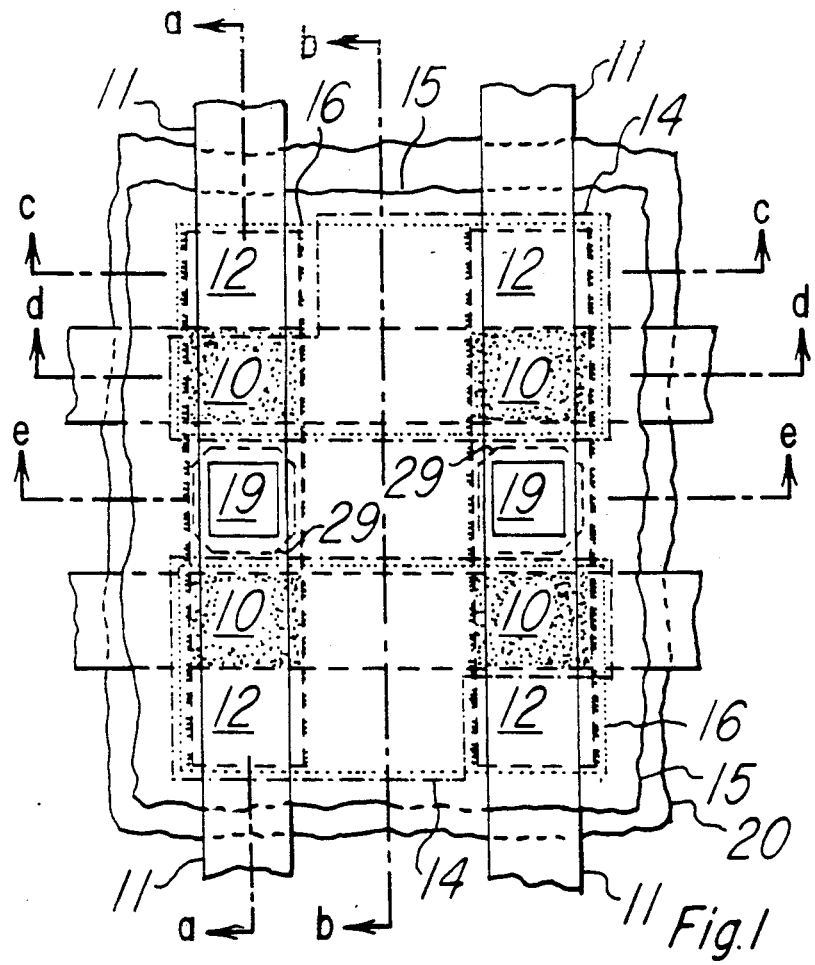
FIG. 1 is a greatly enlarged plan view of a small portion of a semiconductor chip showing the physical layout of a part of a one-transistor dynamic cell array employing memory cells with stacked tantalum capacitors according to the invention.

Referring to FIGS. 1, 2 and 3a-3e, a semiconductor memory device is shown consisting of an array of dynamic one-transistor cells employing stacked tantalum capacitors according to the invention. Each cell includes an access transistor 10 connecting a "bit" or column line 11 to an N+ capacitor terminal 12 when a "word" or row line 13 is addressed. The stacked capacitor structure includes three levels of tantalum 14, 15 and 16, separated from one another by tantalum oxide layers 17 and 18. The central level 15 is a common plane which is connected to supply voltage Vdd or to ground, and serves as one plate for all capacitors in the array. The lower tantalum level 14 makes contact to one N+ area 12, and the upper tantalum level 16 makes contact to an N+ area 12 for an adjacent cell. The tantalum plates 14 and 16 are shaped to cover a maximum amount of surface area on the face of the substrate to provide a high capacitance, but the lower must be cut out above one area 12 to allow the upper to make contact; the two capacitors of adjacent cells will have the same magnitude of capacitance, since the middle level 15 is also cut away above the area 12 where the upper makes contact. It is noted that the capacitor levels 14, 15 and 16 can overlie the gates of the access transistors 10, one contact area 12, and the spaces between columns, so all of this space is utilized twice. In the space between pairs of cells, contact areas 19 provide for the metal-to-silicon contacts between the bit lines 11 and the access transistors.

Figure 2:
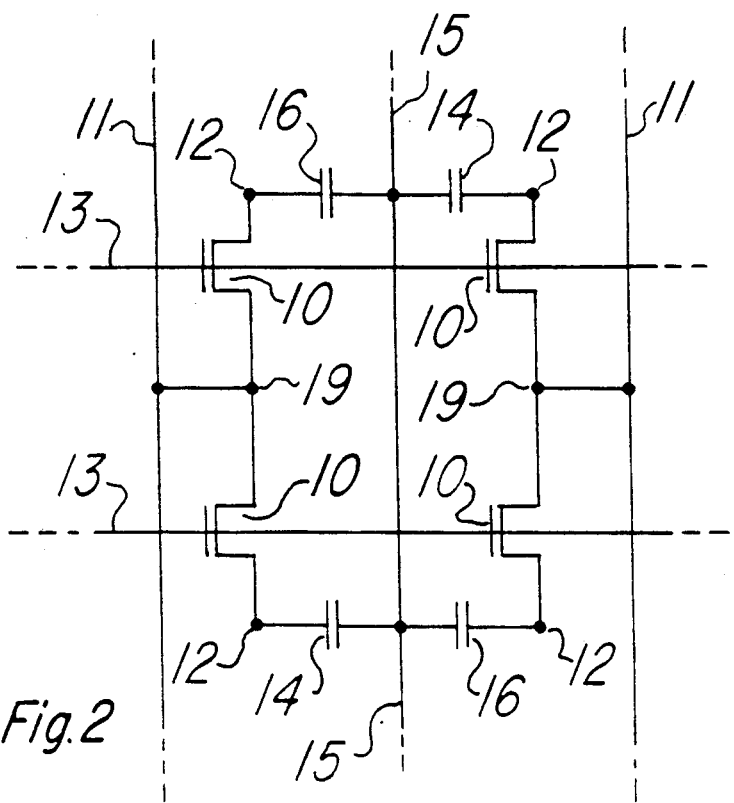
FIG. 2 is an electrical schematic diagram of the part of the cell array of FIG. 1.
Figure 3A:
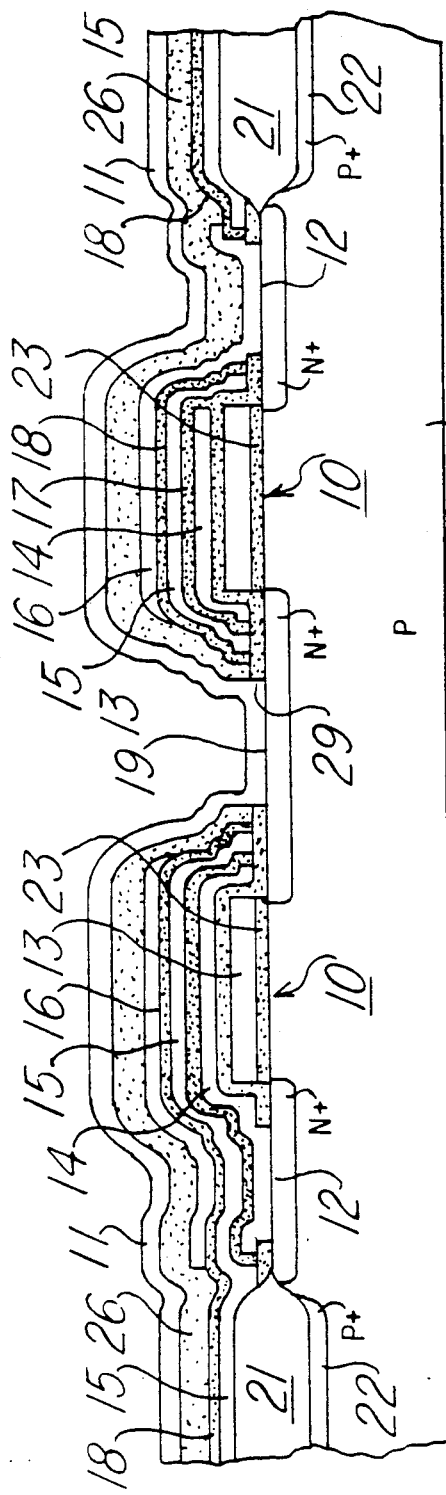
FIG. 3a-3e are elevation views in section of the cells of FIG. 1, taken along the lines a—a, b—b, c—c, d—d and e—e, respectively.
Figure 3B:
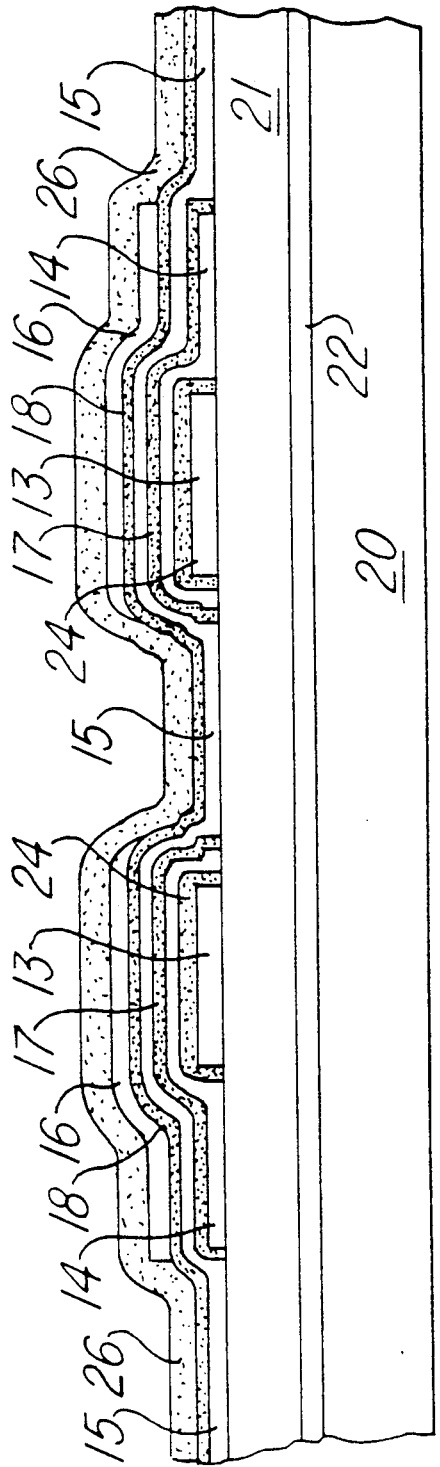
Figure 3C:
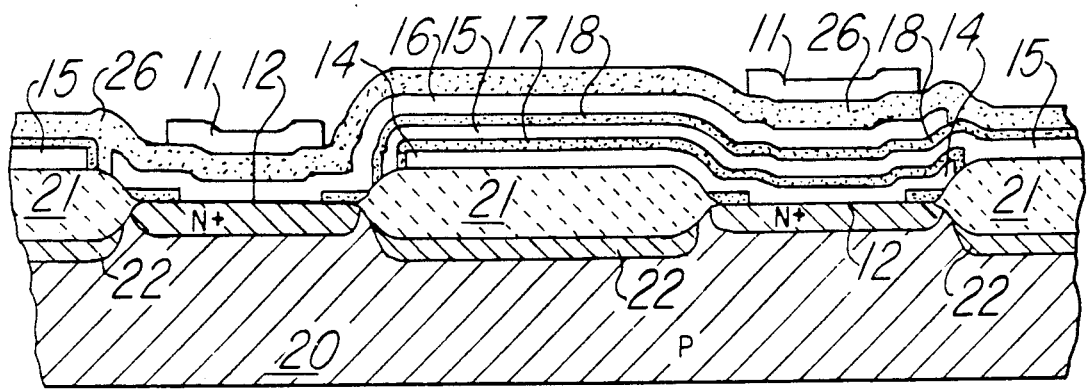
Figure 3D:
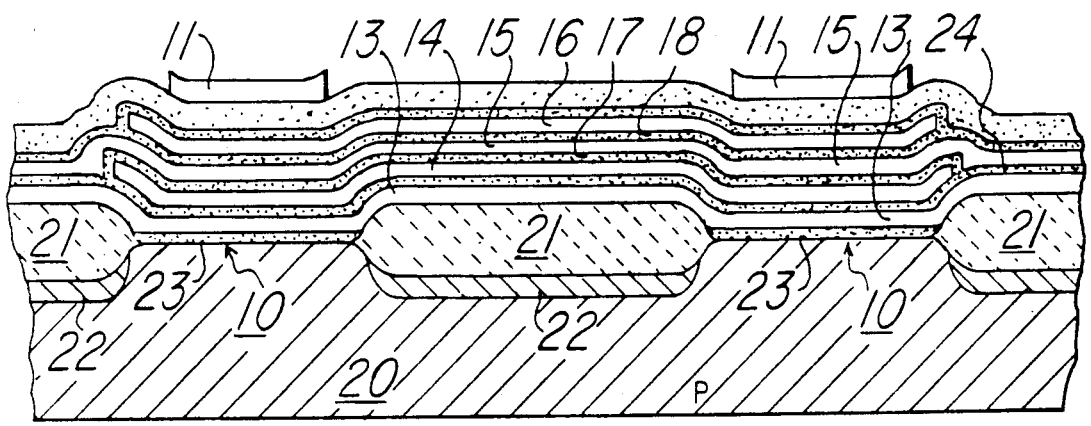
Figure 3E:
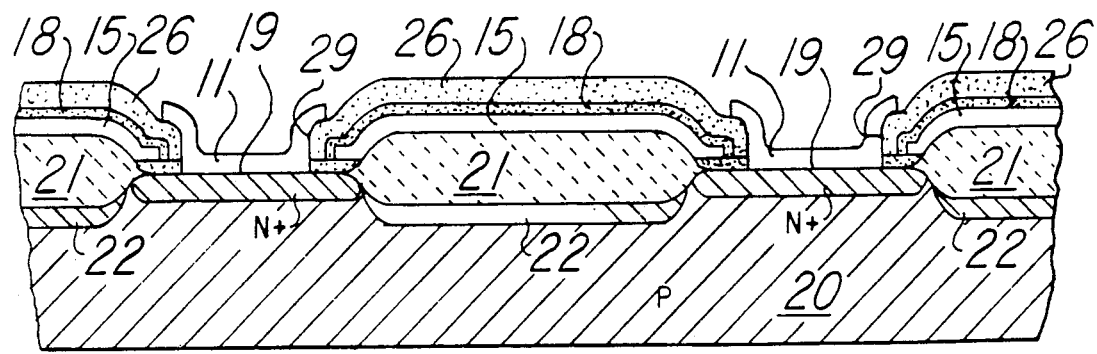

A "256K" memory device would have $2^{18}$ or 262,144 cells like the four seen in FIGS. 1 and 2, all on one chip 20; although usually partitioned, this is an array of 512×512 cells in simplist form, so 512 of the row lines 13 and 512 of the bit lines 11 would be needed. Each contact 19 is shared by two cells so only half as many contacts as cells are needed. Preferably, the memory device is in a silcon chip 20 of less then 40,000 sq. mils, or about 200 mils on a side. A capacitor area of about 2×5 micron with a $Ta_2O_5$ dielectric of 400 Å will provide a capacitance value of 50 ffd, which is adequate for this device, and much more favorable than a silicon oxide dielectric type of capacitor as in U.S. Pat. Nos. 4,055,444 or 4,240,092.

The face of the chip 20 is covered by field oxide 21 in all areas except where the transistors 10 and contacts 12 and 19 exist. Channel stop regions 22 are provided beneath all of the field oxide. Thin silicon oxide layer 23 provides the gate insulator, and a thermal oxide coating 24 separates the polysilicon from the lower tantalum layer 14 and covers the silicon face. Contact holes 25 in the oxide 24 allow the layer 14 (or layer 16) to make contact at the areas 12. An interlevel oxide layer 26 insulates the tantalum layer 16 from the metal strips 11, with a hole or opening 29 in this layer 26 allowing the contact 19 to be made.

Figure 4A:
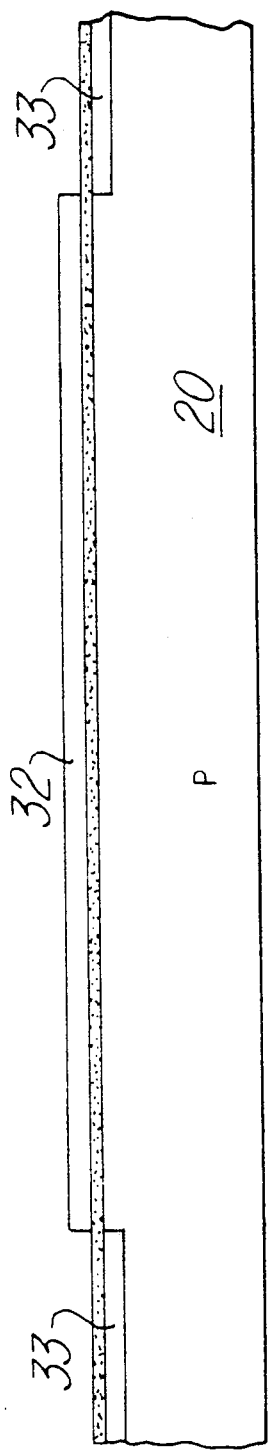

Turning now to FIGS. 4a-4e, a process for making the cell array according to the invention will be described. The starting material is a slice of P type monocrystalline silicon typically four inches in diameter, cut on the <100> plane, of a resistivity of about ten ohm-cm, or alternatively P— epi on a P+ substrate. In the Figures the portion shown of the bar 20 represents only a very small part of one bar or chip, which in turn is a very small part of the slice. One slice contains several hundred bars. After appropriate cleaning, the slice is oxidized by exposing to oxygen in a furnace at an elevated temperature of over 1000° C. to produce an oxide layer 31 over the entire slice of a thickness of about 350 Å. Next a layer 32 of silicon nitride of about 1000 Å thickness is formed over the entire slice by exposing to an atmosphere of dicholorsilane and ammonia in a reactor. A coating of photoresist is applied to the entire top surface of the slice, then exposed to ultraviolet light through a mask which defines the desired pattern of the thick field oxide 21 and the P+ channel stops 22. The resist is developed, leaving areas where nitride is then removed by etching the exposed part of the nitride layer but leaving in place the oxide layer 31, as seen in FIG. 4a.

Using photoresist and nitride as a mask, the slice is subjected to a boron implant step to produce the channel stop regions in unmasked regions 33 of the silicon. The regions 33 will not exist in the same form in the finished device, because silicon is consumed in the field oxidation procedure. Usually the slice is subjected to a heat treatment after implant, prior to field oxide growth, as set forth in the above-mentioned U.S. Pat. No. 4,055,444.

Figure 4B:
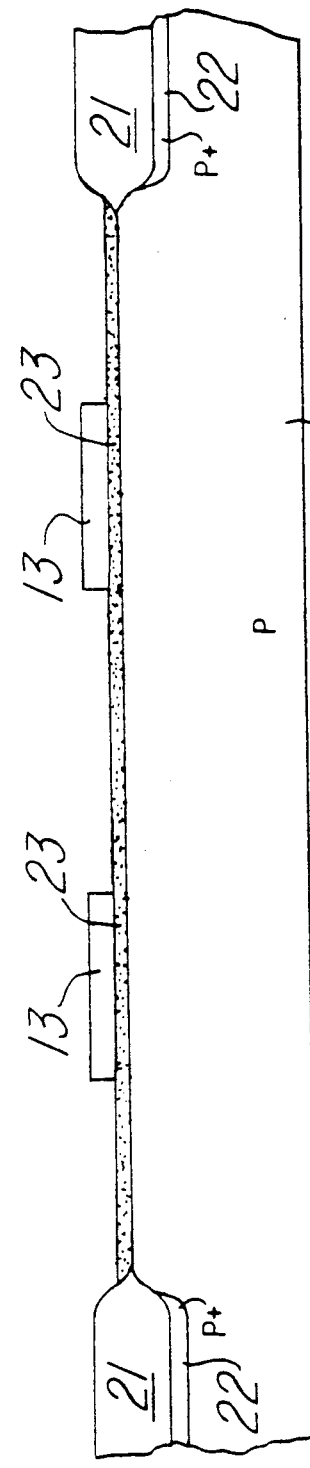

The next step in the process is the formation of field oxide 21 by subjecting the slices to steam or an oxidizing atmosphere at about 900° C. or above for perhaps six hours or more. This causes a thick field oxide layer 21 to be grown as seen in FIG. 4b, extending into the silicon surface as silicon is consumed, with the remaining part of the nitride layer 32 masking oxidation. The thickness of the layer 21 is about 8000 Å, part of which is above the original surface and part below. The boron doped P+ regions 33 formed by implant are partly consumed, but also diffuse further into the silicon ahead of the oxidation front to produce P+ field stop regions 22 which are much deeper than the original regions 33.

Next the remaining nitride layer 33 is removed by an etchant which attacks nitride but not silicon oxide, then the oxide 31 is removed by etching, and the exposed silicon is cleaned. The gate oxide layer 23 is grown by, thermal oxidation, to a thickness of about 300 Å.

As also seen in FIG. 4b a layer of polycrystalline silicon, or polysilicon plus moly silicide, is deposited over the entire slice in a reactor using standard techniques to a thickness of about 6000 Å. This polysilicon layer is patterned by applying a layer of photoresist, exposing to ultraviolet light through a mask prepared for this purpose, developing, then etching the exposed polysilicon to define the row lines 13, transistor gates and like interconnections.

Figure 4C:
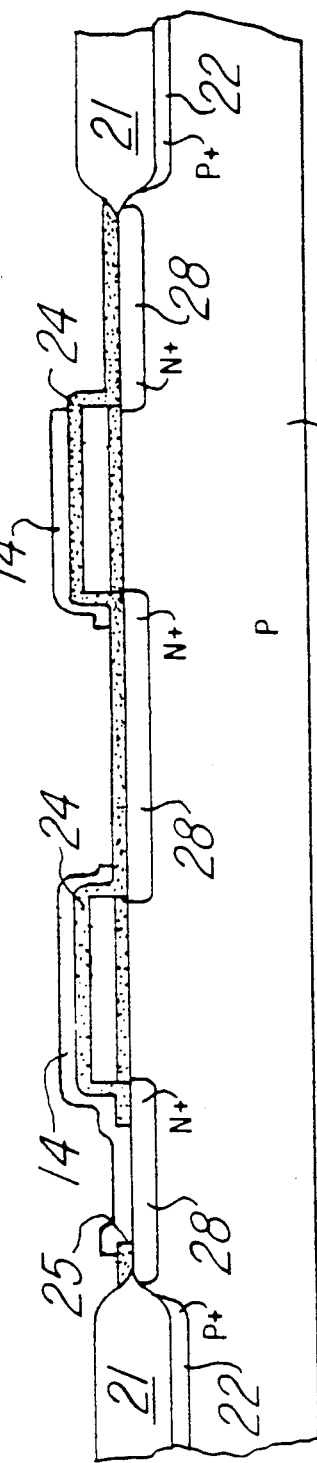

Referring to FIG. 4c, an arsenic implant is now performed to create the N+ source/drain regions 28 where contacts 12 and 19 are made, using the polysilicon 13 and its underlying oxide 23 along with the thick field oxide 21 as a self-align mask.

The exposed surface of the polysilicon is covered by an oxide coating 24 formed by thermal oxidation. This coating functions to insulate the polysilicon from the first tantalum layer 14. Using a photoresist mask, an opening 25 is etched in this oxide 24 to expose the contact area 12 for one of each pair of transistors 10. Then, a first layer 14 of tantalum is deposited, as by evaporation or sputtering, then patterned by a photoresist mask and etch step.

Turning now to FIG. 4d, a tantalum oxide layer 17 is formed, usually by thermal oxidization of the tantalum layer 14. Since tantalum oxidizes at about 500° C., almost no oxidization of exposed silicon occurs. Alternatively, the tantalum may be anodically oxidized in solution or plasma. Then another layer 15 of tantalum is deposited to create the central level, and this layer is patterned to open the holes 29 where the metal-to-silicon contacts 19, or upper-tantalum 16 to silicon contacts 12, are to be made. Another tantalum oxide layer 18 is formed as before, and over this the third tantalum layer 16 is deposited as seen in FIG. 4e. The top layer 16 is patterned to leave the shape seen in FIGS. 1 and 3a-3e.

A thick layer 26 of silicon oxide is deposited over the entire slice by decomposition of silane at a low temperature, about 400° C. This layer insulates the metal layer from the layer of polycrystalline silicon and other areas of the face of the bar, and is referred to as multilevel oxide.

The multilevel oxide layer 26 and thermal oxide 24 are patterned by a photoresist operation which exposes holes or openings 29 for what will be metal-to-silicon contacts. Metal contacts and interconnections are made in the usual manner by depositing a thin film of aluminum over the entire top surface of the slice then patterning it by a photoresist mask and etch sequence, leaving the metal strips 11 and other metal elements. A protective overcoat is then deposited and patterned to expose the bonding pads, and the slice is scribed and broken into individual bars which are packaged in the customary manner.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed is:

1. A semiconductor memory device including an array of one-transistor memory cells, each cell having an access transistor with a source-drain path and a gate, comprising:
   a stacked tantalum capacitor structure shared by each pair of adjacent cells of said array; the stacked tantalum capacitor structure shared by each pair of adjacent cells of array; the stacked tantalum capacitor structure having first, second and third tantalum layers overlying one another and overlying the gates of said access transistors of said pair of adjacent cells; the first and third tantalum layers being separately connected to source-drain paths of opposite ones of the access transistors of said pair of adjacent cells; the second tantalum layer being connected to a common electrical potential; and tantalum oxide dielectric between the first and second and between the second and third tantalum layers.

2. A device according to claim 1 wherein column lines are connected to the source-drain paths of all the transistors of the array, and row lines are connected to the gates of all transistors in the array.

3. A device according to claim 1 wherein all said cells are formed in a face of a semiconductor substrate, and the transistors are of the insulated gate field-effect type.

4. A semiconductor memory device including an array of one-transistor memory cells, each cell having an access transistor with a source-drain path and a gate, comprising:
a stacked capacitor structure shared by each pair of adjacent cells of said array; the stacked capacitor structure having first, second and third conductive layers overlying one another and overlying the gates of said access transistors of said pair of adjacent cells; the first and third conductive layers being separately connected to source-drain paths of opposite ones of the access transistors of said pair of adjacent cells; the second conductive layer being connected to a common electrical potential; and a dielectric layer between the first and second and between the second and third conductive layers.

5. A device according to claim 4 wherein column lines are connected to the source-drain paths of all the transistors of the array, and row lines are connected to the gates of all transistors in the array.

6. A device according to claim 5 wherein all said cells are formed in a face of a semiconductor substrate, and the transistors are the insulated gate field-effect type.

7. A device according to claim 6 wherein the stacked capacitor structure overlies the space between said column lines.

8. A device according to claim 7 wherein said first, second and third conductive layers comprise tantalum and said dielectric layer is tantalum oxide.

9. A semiconductor memory device including an array of one-transistor memory cells, each cell comprising:
A. an access transistor with a source-drain path and a gate;
B. a stacked capacitor structure having first, second and third conductive layers overlying one another and overlying the gate, one of the first and third conductive layers being connected to the source-drain path of said access transistor, the second conductive layer connected to a reference electrical potential;
C. a first dielectric layer between the first and second conductive layers;
D. a second dielectric layer between the second and third conductive layers; and
E. for each cell only one of the first and third conductive layers is connected to the source-drain path of that cell's access transistor.

10. A device according to claim 9 wherein column lines are connected to all of said source-drain paths of the array, and row lines are connected to the gates of all transistors in the array.

11. A device according to claim 10 wherein all said memory cells are formed in a face of a semiconductor substrate, and the access transistors are the insulated gate field-effect type.

12. A device according to claim 11 wherein said conductive layers are tantalum and said dielectric layers are tantalum oxide.

13. A device according to claim 9 wherein memory cells in the array are formed in pairs with a stacked capacitor structure shared by each pair and wherein for each pair the first conductive layer is connected to the source-drain path of a first cell and the third conductive layers is connected to the source-drain path of a second cell.

14. A semiconductor memory device including a memory array, said device comprising:
A. plural word lines spaced apart from one another in said memory array;
B. plural bit lines spaced apart from one another in said memory array; and
C. plural memory cells in said array, each memory cell including an access transistor presenting a source-drain path and a gate, and including a capacitor structure comprising at least upper, middle and lower plates each separated by an insulating dielectric material, said gate being connected between one of said capacitor plates and one of said bit lines, said capacitor structure extending over the space between at least a pair of adjacent bit lines.

15. The memory device of claim 14 in which said capacitor structure overlies a pair of adjacent word lines.

16. The memory device of claim 14 in which said capacitor structure overlies said gate of said access transistor.

17. The memory device of claim 14 in which the source-drain paths of two adjacent memory cells connect to one bit line.

18. The memory device of claim 14 in which the capacitor structures of two adjacent memory cell pairs overlie one another.

19. A semiconductor memory device including a memory array, said device comprising:
A. plural word lines in said memory array;
B. plural bit lines in said memory array;
C. plural memory cells in said array, each memory cell including an access transistor presenting a source-drain path and a gate and a capacitor structure, said cells being arranged in groups of first and second pairs of memory cells, each pair having first and second access transistors, for each pair of memory cells said respective capacitor structures overlying one another and one word line connecting to both transistor gates, and between said first and second pairs of memory cells one bit line connecting to both said first access transistors of said first and second pairs of said memory cells and another bit line connecting to both said second access transistors of said first and second pairs of said memory cells.

20. A semiconductor memory device including an array of one-transistor memory cells, each cell having an access transistor with a source-drain path and a gate, comprising:
a capacitor structure shared by each pair of adjacent cells of said array; the capacitor structure having first, second and third conductive layers overlying one another and overlying the gates of said access transistors of said pair of cells; the first and third conductive layers being separately connected to source-drain paths of opposite ones of the access transistors of said pair of adjacent cells; the second conductive layer being connected to a common electrical potential; and dielectric material between the first and second and between the second and third conductive layers.

* * * * *